United States Patent
Fujisawa

(10) Patent No.: US 6,563,376 B2
(45) Date of Patent: May 13, 2003

(54) MUTE CIRCUIT AND DIGITAL AUDIO AMPLIFIER CIRCUIT

(75) Inventor: Masanori Fujisawa, Kyoto (JP)

(73) Assignee: Rohm Co,. Ltd., Kyoto (JP)

( * ) Notice: Subject to any disclaimer, the term of this patent is extended or adjusted under 35 U.S.C. 154(b) by 0 days.

(21) Appl. No.: 09/781,440

(22) Filed: Feb. 13, 2001

(65) Prior Publication Data

US 2001/0013808 A1 Aug. 16, 2001

(30) Foreign Application Priority Data

Feb. 14, 2000 (JP) ........................................ 2000-035570

(51) Int. Cl.[7] .............................. H03F 3/38; H03F 3/217
(52) U.S. Cl. ........................................ 330/10; 330/251
(58) Field of Search ........................ 330/10, 207 A, 330/251; 381/94.5, 120

(56) References Cited

U.S. PATENT DOCUMENTS 6,118,336 A * 9/2000 Pullen et al. .................. 330/10

FOREIGN PATENT DOCUMENTS

| JP | 1-67818 | 5/1989 |
| JP | 6-11090 | 2/1994 |
| JP | 2000-233965 | 8/2000 |
| JP | 2001-223536 | * 8/2001 |

* cited by examiner

*Primary Examiner*—Steven J. Mottola
(74) *Attorney, Agent, or Firm*—Mattingly, Stanger & Malur, P.C.

(57) ABSTRACT

A mute circuit for a digital audio amplifier circuit includes a PWM drive circuit which receives analog audio signals and generates drive pulses in PWM modulated depending on the amplitude of the received analog audio signals and further depending on the positive and negative polarity of the analog audio signals with respect to the amplitude reference level and supplies the same to a push-pull output circuit; a switch circuit including a third transistor inserted either between a first transistor at push side in the push-pull output circuit and a power source line or between a second transistor at pull side in the push-pull output circuit and a reference potential line; and a time constant circuit which drives the third transistor from OFF to ON depending on a power source making.

10 Claims, 3 Drawing Sheets

MUTE CIRCUIT AND DIGITAL AUDIO AMPLIFIER CIRCUIT

BACKGROUND OF THE INVENTION

1. Field of the Invention

The present invention relates to a mute circuit and a digital audio amplifier circuit and, more specifically, in connection with a digital audio amplifier circuit which produces an output signal corresponding to an amplitude reference level of an analog audio signal by driving an output circuit with a PWM modulated drive pulse (hereinbelow will be referred to as PWM pulse) even under a condition where no sound is outputted because of substantially zero amplitude level of an audio signal, in that under a so called soundless condition, relates to a mute circuit and digital audio amplifier circuit which can easily prevent a pop sound under a soundless condition at the time of making a power source.

2. Background Art

In an audio amplifier circuit using such as transistors, when turning "ON" a power switch, an unpleasant abnormal sound such as so called pop sound is generally involved and in the worst case a speaker can be damaged by a signal via a power amplifier relating to the pop sound. Therefore, a mute circuit is generally inserted in a route for audio signals and the route for the audio signals is forcedly interrupted or grounded until such as a power amplifier reaches to a steady stable condition after making power source.

In a low voltage drive analog audio amplifier circuit, a boost trap circuit is used which prevents a saturation of a drive stage and causes to generate a high output voltage. In this sort of amplifier circuit, a switch circuit is provided between a boost trap power source line and a power source line Vcc and through turning ON/OFF of this switch circuit an output stage is placed into a mute condition.

As an example of a mute operation which interrupts a power source line, a structure and operation of a mute circuit in such analog amplifier circuit will be explained specifically with reference to a block diagram as shown in FIG. 3.

Numeral 1 is an audio amplifier circuit therefor, wherein an area surrounded by a dot and chain line is usually formed into an IC, and includes such as an output amplifier 2, a mute signal generation circuit 3, an electrolytic capacitor C for a boost trap, a resistor R, a switch circuit 4 for muting, an output capacitor Co and a speaker 5. Further, a mute circuit is constituted by the mute signal generation circuit 3 and the switch circuit 4 for muting.

The output amplifier 2 is constituted by a constant current source 20, a current mirror circuit 21, an input stage amplifier 22 and an output stage amplifier 23, and the current mirror circuit 21 and a drive transistor Q3 in the output stage amplifier 23 receive electric power from a boost trap power source line Vbs. Further, an illustration of a circuit at sink side (pull side) of the output amplifier 2 is omitted in the drawing.

The current mirror circuit 21 is constituted by an input side transistor Q1 and an output side transistor Q2 and the transistor Q1 is connected to the constant current source 20 and causes to flow out current I. As a result, a flow out current I flows through the output side transistor Q2. The input stage amplifier 22 causes to sink a part of the flow out current I in response to an input signal and supplies a drive signal to the base of the drive transistor Q3 in the output stage amplifier 23. An output stage transistor Q4 in the output stage amplifier 23 is driven when the base thereof receives an output current of the transistor Q3.

Numeral 24 is an output terminal to which the emitter of the transistor Q4 is connected and its output voltage is kept at Vo. Further, the collector side of the transistor Q4 is connected to the power source line Vcc. Between the output terminal 24 and the boost trap power source line Vbs the boost trap capacitor C is provided. Numeral 25 is an input terminal provided at the input stage amplifier 22 to which audio signals are supplied from a prior stage.

The switch circuit 4 for muting is constituted by a PNP type transistor Q5 of which emitter is connected to the power source line Vcc and of which collector is connected to the boost trap power source Vbs via the resistor R, and when the base thereof receives a mute signal M of HIGH level (hereinbelow will be simply referred to as "H") from the mute signal generation circuit 3, the transistor Q5 is turned OFF and is set in a mute condition. When no mute signal M is received, the mute signal M assumes LOW level (hereinbelow will be simply referred to as "L") and the switch is rendered to be turned ON. The mute signal generation circuit 3 generates the mute signal M, when the power switch is "ON" (at the time of making) or a mute switch is operated through a manual operation.

Now, a mute circuit in a digital audio amplifier circuit will be explained. As shown in FIG. 4, in the digital audio amplifier circuit signals from a digital signal processor (DSP) 6 are converted into analog signals at D/A converter circuit (D/A) 7, and the converted analog signals are inputted to a PWM switching power amplifier 8. The PWM switching power amplifier 8 generates PWM pulses depending on the amplitude of the analog signals, and the output stage push-pull circuit is push-pull driven depending on the pulse width, for example, with pulses of 700 kHz and a discharge current and a sink current of 700 kHz are generated at an output terminal 8a and are outputted to the speaker 5 via an L type filter 9. The present assignee has applied such digital audio amplifier circuit as U.S. patent application Ser. No. 09/0433,048 (which corresponds to Japanese Patent Application No.10-313433 (JP-A-2000-223956).

In this sort of digital audio amplifier circuit, when the amplitude of the analog signals is at the minimum voltage, for example, at a reference level of the signal amplitude (for example, under a condition of no signal at voltage amplitude≈0V), the pulse width of the PWM pulses is not zero, but is set at a duty ratio of about 10%, thereby, with such PWM pulses the push side output transistor and the pull side output transistor are alternatively driven. Through this drive a charge and discharge in a short period is repeated to the output capacitor Co having a large capacitance, thereby, the output signal level is kept at a value corresponding to the reference level of the audio signal amplitude as well as a control of preventing an output generation at the speaker side is performed. When the amplitude of the analog signals reaches the maximum voltage value, the duty ratio of the PWM pulses is set at about 90% and either the push side output transistor or the pull side output transistor is driven at 700 kHz depending on the polarity of the analog signals.

Different from the analog audio amplifier circuit, in such digital audio amplifier circuit, since the output stage performing a push-pull operation is driven by a pulse drive depending on PWM modulated sections, PWM pulses having duty of about 10% are generated from the PWM modulation circuit 8 simultaneously with the power source making even under the initial soundless condition and the push side transistor and the pull side transistor are alternatively driven. For this reason, the drive currents at the pull side and the push side in the push-pull circuit deviate, thereby, the output of the push-pull circuit varies at the time of making power source and the variation appears via the output capacitor as a pop sound at the speaker.

This problem can be solved, like the analog audio amplifier circuit as has been explained above, by outputting the mute signals M from the mute signal generation circuit 3 in response to the power source making or the mute operation and interrupting the electric power at the output stage. However, if the above measure is taken, when the switch circuit for muting which interrupts electric power at the output stage changes from OFF to ON after completing muting, through the power supplied at this moment the level at the output terminal connected to the output stage performing a push-pull operation varies by the drive with PWM pulses under the soundless condition which rather causes to generate a pop sound.

SUMMARY OF THE INVENTION

An object of the present invention is to resolve the above conventional problems and is to provide, in connection with a digital audio amplifier circuit which produces an output signal corresponding to an amplitude reference level of an analog audio signal by driving an output circuit with PWM pulses even under a condition of a so called soundless condition where amplitude level of an audio signal is substantially zero, a mute circuit which can prevent a pop sound under a soundless condition at the time of making a power source.

Another object of the present invention is to provide a digital audio amplifier circuit which produces an output signal corresponding to an amplitude reference level of an analog audio signal by driving an output circuit with PWM pulses even under a condition of a so called soundless condition where amplitude level of an audio signal is substantially zero, which can easily prevent a pop sound under a soundless condition at the time of making a power source.

Features of the mute circuit and the digital audio amplifier circuit according to the present invention which achieve the above objects are, in a mute circuit in a digital audio amplifier circuit which includes a PWM drive circuit receiving analog audio signals and generating PWM modulated PWM pulses depending on the amplitude of the received analog audio signals and an output circuit performing a push-pull operation driven by the PWM pulses and applying it's output to a speaker via an output capacitor, and which produces in the output circuit an output signal corresponding to an amplitude reference level of the analog audio signal by driving the output circuit with PWM pulses even under a condition where the amplitude level of the analog audio signal is substantially zero, wherein the output circuit comprises a first transistor performing a push operation and a second transistor performing a pull operation of which output sides are connected in series between a power source line and a reference potential line such as ground, the PWM drive circuit generates the PWM pulses depending on the positive and negative polarity of the analog audio signals with respect to the amplitude reference level, and further the mute circuit comprises a switch circuit including a third transistor inserted either between the first transistor and the power source line or between the second transistor and the reference potential line and a time constant circuit which drives the third transistor from OFF to ON depending on a power source making.

As has been explained above, according to the present invention, since the switch circuit for muting which is inserted in series in the output circuit is slowly driven from OFF to ON by the time constant circuit depending on the power source making, even when PWM pulses are generated at a low duty ratio, for example, at about 10%~20% under a soundless condition at the time of the power source making and the transistors at the pull side and the push side are alternatively driven, the power source voltage gradually increases to charge and discharge the output capacitor, thereby, when the output voltage of the push-pull output circuit moves to the amplitude level of the audio signals under the soundless condition at the time of power source making, a sudden voltage change in the output is suppressed.

As a result, in a digital audio amplifier circuit which generates audio outputs through a PWM pulse drive, a power source making can be performed without generating a pop sound.

DESCRIPTION OF THE PREFERRED EMBODIMENTS

Figure 1:
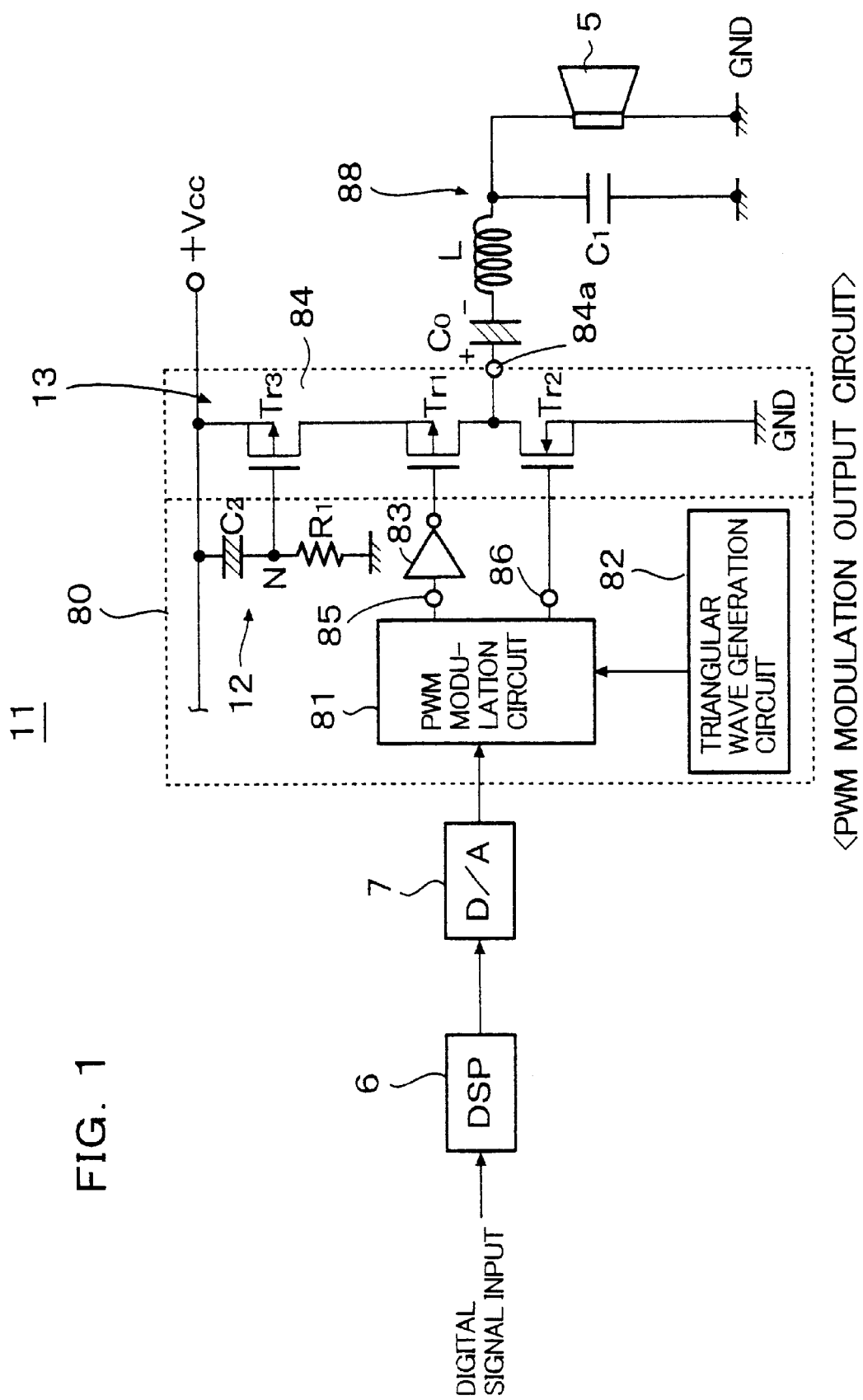
FIG. 1 is a block diagram of a digital audio amplifier circuit representing one embodiment in which a mute circuit according to the present invention is applied.

A digital audio amplifier circuit 11 includes a PWM modulation output circuit 80 in which a mute circuit constituted by a mute signal generation circuit 12 and a mute switch circuit 13 provided in an output stage circuit 84 performing a push-pull operation.

The PWM modulation output circuit 80 is constituted by a PWM modulation circuit (PWM drive circuit) 81 which generates PWM drive pulses, a 700 kHz triangular wave generation circuit 82, an invertor 83 and the output stage circuit 84 performing a push-pull operation, and the PWM modulation circuit 81 receives the signals from the digital signal processor (DSP) 6 via the D/A 7 as the signals converted into analog signals from the audio digital signals. The PWM modulation circuit 81 is constituted by two comparators for positive and negative sides which compare the output from the triangular wave generation circuit 82 and the input analog signals, receives the output signals from the D/A 7 as the input signals, compares the positive and negative amplitude level in the respective comparators depending on the positive and negative signal level and generates at a positive polarity side output 85 and a negative polarity side output 86 PWM pulses of 700 kHz of which pulse width is enlarged depending on the comparison when the signal level is large at the respective positive and negative sides respectively.

In the above instance, the positive side comparator receives the input signal at the (+) input side and the triangular wave output at the (−) input of the reference side, and the negative side comparator receives the input signal at the (−) input side and the triangular wave output at the (+) input of the reference side.

Further, in the present embodiment, when the voltage value of the analog signals corresponds to the minimum level (corresponding to the soundless condition), the push side and pull side output transistors which are set at a duty ratio of about 20% are alternately driven. When the amplitude of the analog signals reaches to the maximum voltage value, either the push side or pull side transistor is driven depending on the polarity of the analog audio signals while the duty ratio thereof being set at about 80%. Still further, the positive and negative polarity of the analog audio signals is determined with reference to its amplitude reference level.

The output stage circuit 84 is a CMOS type push-pull output circuit in which the output side (source-drain) of a p channel MOS transistor Tr1 and the output side (source-drain) of an n channel MOS transistor Tr2 are disposed in series while connecting the both drains between the power source line +Vcc and the ground GND. To the gate of the p channel MOS transistor Tr1 PWM pulses generated at the positive polarity output 85 are inputted via the invertor 83 to drive the transistor Tr1 into ON/OFF. On the other hand, the transistor Tr2 is driven into ON/OFF directly by the PWM pulses generated at the negative polarity side output 86.

Numeral 84a is an output terminal of the output stage circuit 84, and Co is an output capacitor connected to the output terminal 84a. Numeral 88 is an L type low pass filter constituted by a coil L and a capacitor C1, wherein one terminal of the coil L is connected to the output terminal 84a via the output capacitor Co, the junction of the coil L and the output capacitor Co is connected to the speaker 5 and the other end of the capacitor C1 is grounded.

Figure 4:
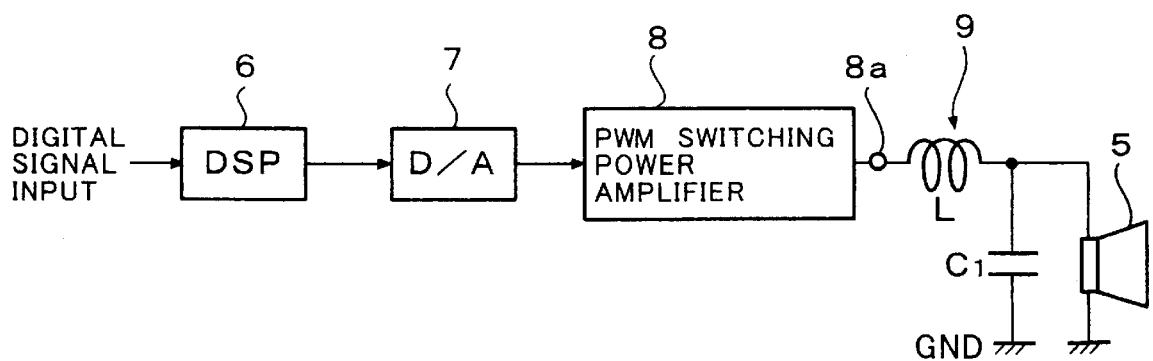
FIG. 4 is a diagram for explaining a conventional digital audio amplifier circuit.

A large difference of FIG. 1 embodiment from FIG. 4 is that the mute signal generation circuit 12 and the mute switch circuit 13 are provided in the push-pull type output stage circuit 84.

The mute switch circuit 13 is constituted by a p channel MOS transistor Tr3, of which drain is connected to the source of the p channel MOS transistor Tr1 and of which source is connected to the power source line +Vcc. Thereby, the transistor Tr3 is inserted between the output side of the transistor Tr1 and the power source line +Vcc.

The mute signal generation circuit 12 is provided between the power source line +Vcc and the ground GND, and is constituted by a series circuit of a capacitor C2 and a resistor R1 wherein the capacitor C2 is placed in upstream and the resistor R1 is placed in downstream. Further, the junction N of the capacitor C2 and the resistor R1 is connected to the gate of the transistor Tr3.

When the terminal voltage at the side of the junction N of the resistor R1 drops, for example, below 0.7V with respect to the power source line +Vcc depending on the RC time constant determined by the capacitance of the capacitor C2 and the resistance of the resistor R1 in the series circuit, the transistor Tr3 is turned ON. At the time of power source making, since the voltage of the power source line +Vcc is applied to the transistor Tr3 and causes the source and gate voltages substantially equal, the transistor Tr3 is turned OFF, and after a predetermined time determined by the CR time constant, the gate voltage of the transistor Tr3 gradually decreases from the power source line +Vcc and moves to the ground GND level. Thereby, the transistor Tr3 gradually moves from OFF to ON. At this moment, the transistor Tr3 moves from the OFF condition to the ON condition more slowly than being driven directly by a mute signal.

Since the transistor Tr3 is driven slowly with such time constant circuit, even when PWM pulses of a low duty ratio under a soundless condition, for example, of about 10%~20% are generated and the PWM modulation circuit 81 alternately drives the pull side and push side transistors in the output stage circuit 84, the voltage generated at the drain side of the transistor Tr3 in the push-pull output stage circuit 84 gradually increases, thereby, the output capacitor Co is charged and discharged depending on the gradually increasing voltage. With this measure, the movement of the output signal of the push-pull output stage circuit 84 toward the reference level is slowed down and a sudden voltage change in the output signal level is suppressed.

In this instance, the movement from OFF to ON of the transistor Tr3 is determined by the time constant. The voltage of the output terminal 84a moves slowly toward the reference potential depending on the time constant. Thereby, no pop sounds are generated. As an example of the time constant, when the resistance of the resistor R1 is about 300 kΩ, the capacitance of about 1 μF is acceptable for the capacitor C2.

Figure 2:
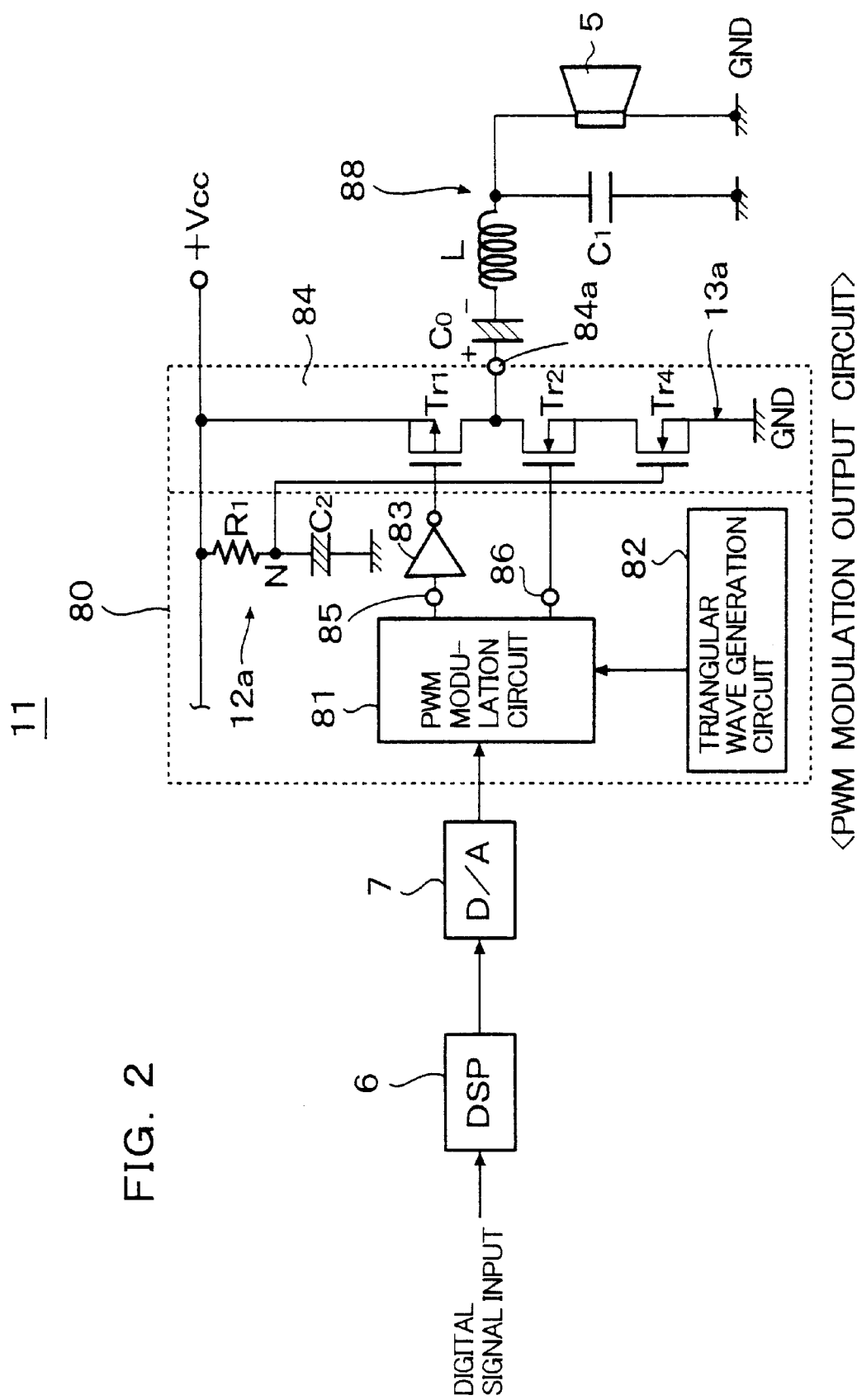
FIG. 2 is a block diagram of a digital audio amplifier circuit representing another embodiment in which a mute circuit according to the present invention is applied.
Figure 3:
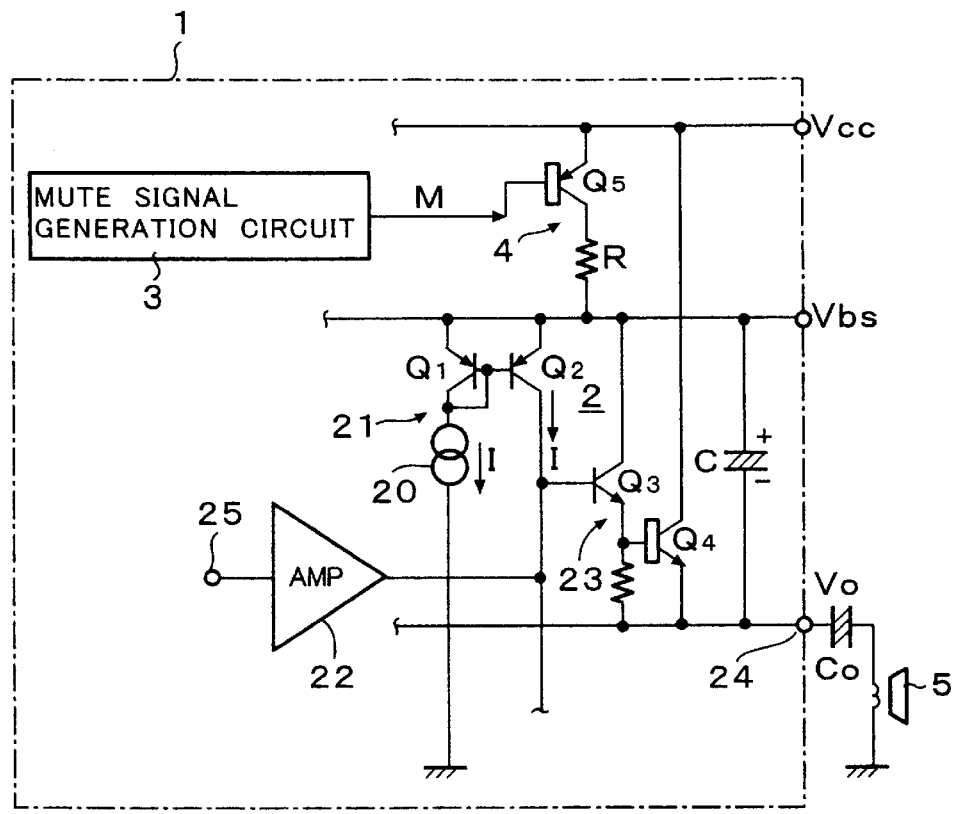
FIG. 3 is a diagram for explaining a mute circuit in a conventional analog audio amplifier circuit.

FIG. 2 is another embodiment in which a mute circuit according to the present invention is applied in which the mute switch is inserted at the ground side of the output stage circuit. Namely, a mute switch circuit 13a is constituted by an n channel MOS transistor Tr4, of which drain is connected to the source of the n channel MOS transistor Tr2 and of which source is connected to the ground GND. Further, in a mute signal generation circuit 12a the capacitor C2 is placed in upstream and the resistor R1 is placed in downstream, in that the connection order is inverted from that in FIG. 1. Namely, one terminal of the resistor R1 which is not connected to the capacitor C2 is connected to the power source line +Vcc and one terminal of the capacitor C2 which is not connected to the resistor R1 is grounded.

Since the operation of FIG. 2 embodiment is substantially the same as that of FIG. 1 embodiment, the explanation thereof is omitted.

As has been explained hitherto, in the embodiments, the switch circuit and the output circuit are constituted by MOS transistors, however, bipolar transistors can be used in place of the MOS transistors.

What is claimed is:

1. A mute circuit for a digital audio amplifier circuit, which includes a PWM drive circuit receiving analog audio signals and generating PWM modulated drive pulses depending on the amplitude of the received analog audio signals, and an output circuit performing a push-pull operation driven by the drive pulses and applying its output to a speaker via an output capacitor, and which causes to produce in the output circuit an output signal corresponding to an amplitude reference level of the analog audio signal by driving the output circuit with drive pulses even under a condition where the amplitude level of the analog audio signal is substantially zero, wherein the output circuit comprises a first transistor performing a push operation and a second transistor performing a pull operation of which output sides are connected in series between a power source line and a reference potential line, the PWM drive circuit generates the drive pulses depending on the positive and negative polarities of the analog audio signals with respect to the amplitude reference level, and further the mute circuit comprises a switch circuit including a third transistor inserted either between the first transistor and the power source line or between the second transistor and the reference potential line, and a time constant circuit which drives the third transistor from OFF to ON depending on the ON state of a power source.

2. A mute circuit according to claim 1, wherein the first transistor is a p channel MOSFET transistor, the second transistor is an n channel MOSFET transistor, the drain of the first transistor and the drain of the second transistor are respectively connected to an output terminal of the output circuit, a gate of the first transistor receives the drive pulses which are generated depending on the positive polarity of the analog audio signals and a gate of the second transistor receives the drive pulses which are generated depending on the negative polarity of the analog audio signals.

3. A mute circuit according to claim 2, wherein the third transistor is a p channel MOSFET transistor, the drive pulses which are generated depending on the positive polarity of the analog audio signals are supplied to the gate of the first transistor via an invertor, the source of the first transistor is connected to the power source line via the drain-source of the third transistor, the time constant circuit is a series circuit connected between the power source line and the reference potential line in the order of a capacitor and a resistor and the junction of the capacitor and the resistor is connected to a gate of the third transistor.

4. A mute circuit according to claim 3, wherein the third transistor is an n channel MOSFET transistor, the drive pulses which are generated depending on the positive polarity of the analog audio signals are supplied to the gate of the first transistor via an invertor, the source of the second transistor is connected to the reference potential line via the drain-source of the third transistor, the time constant circuit is a series circuit connected between the power source line and the reference potential line in the order of a resistor and a capacitor and the junction of the resistor and the capacitor is connected to a gate of the third transistor.

5. A digital audio amplifier circuit comprising an output circuit performing a push-pull operation driven by drive pulses and applying its output to a speaker via an output capacitor, and which causes to produce in the output circuit an output signal corresponding to an amplitude reference level of the analog audio signal by driving the output circuit with the drive pulses even under a condition where the amplitude level of the analog audio signal is substantially zero, wherein the output circuit comprises a first transistor performing a push operation and a second transistor performing a pull operation of which output sides are connected in series between a power source line and a reference potential line such as ground, and the digital audio amplifier circuit further comprises a PWM drive circuit which receives the analog audio signals and generates PWM modulated drive pulses depending on the amplitude of the received analog audio signals and depending on the positive and negative polarities of the analog audio signals with respect to the amplitude reference level; a switch circuit including a third transistor inserted either between the first transistor and the power source line or between the second transistor and the reference potential line; and a time constant circuit which drives the third transistor from OFF to ON depending on the ON state of a power source.

6. A digital audio amplifier circuit according to claim 5, wherein the first transistor is a p channel MOSFET transistor, the second transistor is an n channel MOSFET transistor, the drain of the first transistor and the drain of the second transistor are respectively connected to an output terminal of the output circuit, a gate of the first transistor receives the drive pulses which are generated depending on the positive polarity of the analog audio signals and a gate of the second transistor receives the drive pulses which are generated depending on the negative polarity of the analog audio signals.

7. A digital audio amplifier circuit according to claim 6, wherein the third transistor is a p channel MOSFET transistor, the drive pulses which are generated depending on the positive polarity of the analog audio signals are supplied to the gate of the first transistor via an invertor, the source of the first transistor is connected to the power source line via the drain-source of the third transistor, the time constant circuit is a series circuit connected between the power source line and the reference potential line in the order of a capacitor and a resistor and the junction of the capacitor and the resistor is connected to a gate of the third transistor.

8. A digital audio amplifier circuit according to claim 7, wherein between the output capacitor and the speaker an L type filter constituted by a coil and a capacitor is provided and the coil is inserted in series between the output capacitor and the speaker.

9. A mute circuit according to claim 6, wherein the third transistor is an n-channel MOSFET transistor, the drive pulses which are generated depending on the positive polarity of the analog audio signals are supplied to the gate of the first transistor via an invertor, the source of the second transistor is connected to the reference potential line via the drain-source of the third transistor, the time constant circuit is a series circuit connected between the power source line and the reference potential line in the order of a resistor and a capacitor and the junction of the resistor and the capacitor is connected to a gate of the third transistor.

10. A digital audio amplifier circuit according to claim 9, wherein between the output capacitor and the speaker an L type filter constituted by a coil and a capacitor is provided and the coil is inserted in series between the output capacitor and the speaker.

\* \* \* \* \*